United States Patent [19]
Meise

[11] 4,243,918
[45] Jan. 6, 1981

[54] SIGNAL INTEGRATOR WITH TIME CONSTANT CONTROLLED BY DIFFERENTIATING FEEDBACK

[75] Inventor: William H. Meise, Wrightstown, Pa.

[73] Assignee: RCA Corporation, New York, N.Y.

[21] Appl. No.: 43,084

[22] Filed: May 29, 1979

[51] Int. Cl.³ .............................................. H01J 29/72
[52] U.S. Cl. ......................................... 315/389; 315/403; 328/209
[58] Field of Search ...................... 315/389, 410, 403; 328/209

[56] References Cited

U.S. PATENT DOCUMENTS

| | | | |
|---|---|---|---|
| 3,646,393 | 2/1972 | Tarr | 315/403 |
| 3,725,726 | 4/1973 | West | 315/389 X |
| 3,947,723 | 3/1976 | Thompson | 315/389 |

Primary Examiner—Malcolm F. Hubler
Attorney, Agent, or Firm—Eugene M. Whitacre; Paul J. Rasmussen; Joseph J. Laks

[57] ABSTRACT

A signal integrating capacitor receives signal current for an integration circuit. A current shunt is coupled to the capacitor. The integrated output is differentiated and degeneratively fed back to the shunting circuit to control the amount of signal current bypassed from the capacitor, thereby increasing the effective time constant associated with the capacitor.

12 Claims, 9 Drawing Figures

U.S. Patent  Jan. 6, 1981  Sheet 1 of 4  4,243,918
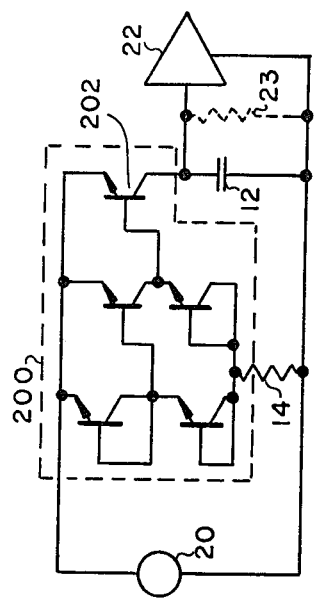
Fig.3
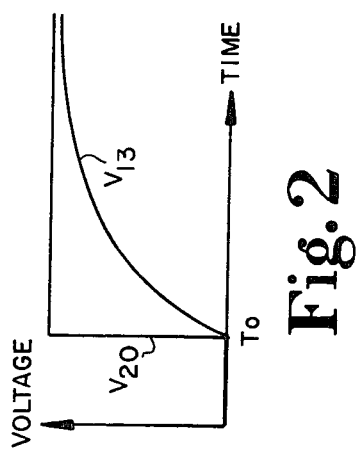
Fig.2
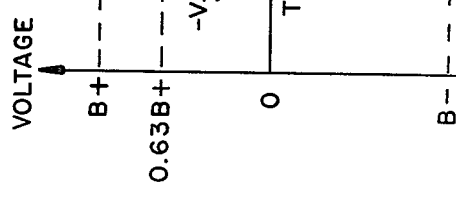
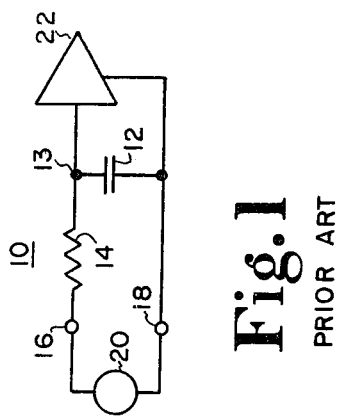
Fig.1
PRIOR ART
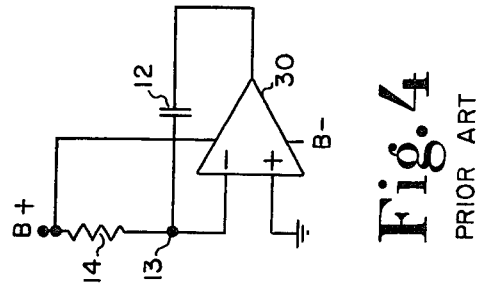
Fig.4
PRIOR ART

SIGNAL INTEGRATOR WITH TIME CONSTANT CONTROLLED BY DIFFERENTIATING FEEDBACK

BACKGROUND OF THE INVENTION

This invention relates to signal integrating circuits with a differentiator coupled in a degenerative feedback path for control of the integrator time constant. The integrators are particularly useful in integrated-circuit applications.

Integrating circuits are widely used in electronics for filtering, frequency processing and the like. For example, in television receivers, integrators are used in synchronizing signal separators for separating out low-frequency portions of the composite television signal; in vertical deflection circuits for generating ramp voltages by which the vertical deflection circuit is controlled; in switching regulators as ramp generators for phase modulation; and in automatic frequency control (AFPC) loops for averaging or frequency control. Consumer products such as television receivers are made in large quantities, and cost considerations have caused manufacturers to increasingly use integrated circuits (IC's) in their manufacture.

Advances in integrated-circuit technology have made it possible to concentrate more functions into each IC. The integration of all the television receiver integrated-circuit processes onto a single or few chips is impeded by several factors. As the number of functions performed and therefore the number of semiconductors increases, the power dissipated and therefore the temperature of the device tend to increase. This problem can be solved by increasing the surface area of the device, by heat sinking and the like. Yield limitations prohibit the use of excessively large semiconductor devices.

Each interface between the integrated-circuit semiconductor chip and an external circuit requires a conductor lead, and a bond between the lead and the IC chip. Each such bond adversely affects the yield of operable encapsulated IC's. Also, as the number of functions performed by each chip increases, the number of interface connections also increases until at some point it becomes uneconomical to use a single chip, and the use of multiple chips becomes more advantageous.

The signal integrator is a very common type of circuit. Many television functions and circuits include integrators. While signal integration can be performed with either an inductor or a capacitor, inductors are not commonly used because of their large physical size and because of the electromagnetic fields which they radiate. Commonly, a resistor and a capacitor form the integrator. While both capacitors and resistors can be formed in integrated circuits, inexpensive IC processing techniques typically limit maximum resistances to the order of 10 kilohms, and capacitances to the order of 10 picofarads.

Discrete capacitors having greater capacitance can be connected to the semiconductor chip and enclosed within the chip carrier, but this arrangement is expensive, and the discrete capacitor must be physically large in order to obtain a large capacitance which is stable with temperature. High-K dielectric materials can reduce the physical size of such a discrete capacitor, but the poor temperature coefficient of high-K dielectrics would then make the integrator termperature-sensitive. The conductivity or leakage of high-K dielectrics may be poor. Thus, present day technology does not permit signal integrators with a relatively long time constant (resistance times capacitance) to be formed in an inexpensive manner within the confines of the IC chip.

It is known in principle to increase the effective time constant of an integrator by reducing the charging current to the capacitor, thereby enabling a relatively small charging current to be produced in response to a signal voltage without the use of a large value resistor. However, the sensing circuit by which the integrated voltage across the integrating capacitor is sensed draws a current which cannot easily be predicted or controlled. Thus, when a small integrating current is applied to the integrating capacitor in response to a signal, the capacitor may charge too quickly and therefore exceed the dynamic limits of the following circuits. The capacitor may actually fail to charge if the current required by the sensing circuit exceeds the current being supplied by the signal-responsive current source.

It is known to increase the effective capacitance of an integrator circuit by the Miller integrator configuration. In the Miller integrator, the input current, in principle, flows only to the charging capacitor. However, the Miller integrator includes a sensing amplifier which produces the above-described indeterminate charging current. Furthermore, the Miller integrator, when used as a ramp generator, may result in a decrease, rather than an increase, in the available signal integrating time. Because the voltage at the output of the Miller amplifier changes at a rate established by the time constant of the RC charging circuit external to the amplifier, this rate is maintained for the entire integrating time. As a result, the dynamic range of the Miller amplifier is quickly exceeded, and the Miller action ceases when the amplifier saturates. The Miller action therefore ceases at a time when the voltage across the integrating capacitor is substantially equal to the supply voltage, and this occurs much earlier than it would in the RC integrator. Thus, the Miller integrator trades off signal integrating time for linearity.

Other signal integrating circuits generate ramp waveforms, for example, by coupling a controllable current source to an integrating capacitor. A feedback circuit coupled to the control terminal of the current source regulates the current magnitude. At low current source values, linearity and stability may be degraded.

It is desirable to design a signal integrating circuit in which, for a given resistor and capacitor, the time allowed for signal integration is increased and whereby for a given time constant the integrating capacitor can be made sufficiently small to be conveniently formed on the IC substrate. It is also desirable to design a signal integrator in which leakage of the integrating capacitor does not affect the integrating time whereby lossy dielectrics may be used for forming the integrating capacitor, further aiding in the size reduction. It is further desirable to design a signal integrator in which the linearity of the integrating capacitor does not substantially affect the integrating time, by which it becomes possible to use reverse-biased semiconductor junctions for the integrating capacitor. It is still further desirable to design a signal integrator with a small integrating capacitance and low-value resistors which nevertheless has a relatively long signal integrating time.

SUMMARY OF THE INVENTION

An integrator includes a source of current responsive to the signal to be integrated. A capacitor is coupled to the source of current to receive current therefrom, thereby forming an integrating circuit. A shunting circuit is coupled to the capacitor. A differentiating circuit is coupled in a degenerative manner to the shunting circuit for reducing the current coupled from the source of current to the integrating capacitor in response to the integrated output signal.

BRIEF DESCRIPTION OF THE DRAWING

FIG. 1 illustrates a prior art signal integrating circuit;

FIG. 2 illustrates waveforms associated with the circuit of FIG. 1;

FIG. 3 illustrates a circuit which provides for the integration and sensing of the cube-root of a signal;

FIG. 4 illustrates a prior art Miller integrator ramp generator;

FIG. 5 illustrates in part waveforms associated with the circuit of FIG. 4;

DESCRIPTION OF THE INVENTION

Figure 6:
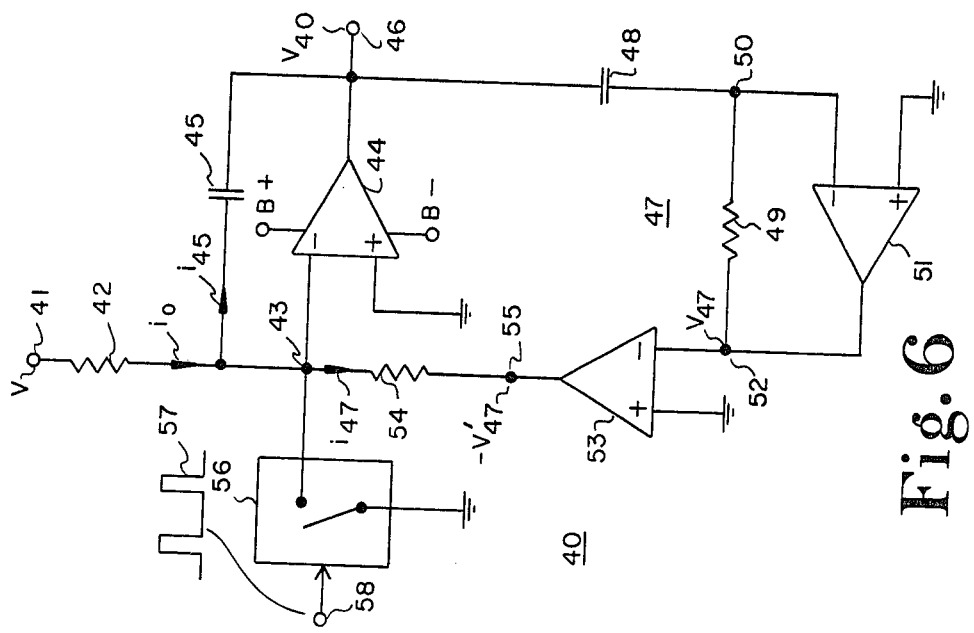
FIG. 6 illustrates a signal integration circuit embodying the invention.

In the prior art circuit of FIG. 1, a signal integrator circuit designated generally as 10 includes an integrating capacitor 12 coupled at a circuit terminal 13 with a resistor 14, thereby forming a series circuit coupled between input terminals 16 and 18 of integrator 10. A signal voltage source, illustrated as a generator 20, is coupled to terminals 16 and 18. A sensing circuit is coupled across capacitor 12. The sensing circuit is illustrated schematically as an amplifier 22 shown with, for example, the baseemitter junction of a transistor, not shown, coupled across the capacitor.

For purposes of explanation, assume that generator 20 produces a step voltage by which input terminal 16 is made positive with respect to input terminal 18 (hereinafter referred to as ground). In FIG. 2, the step function occurring at time $T_0$ is illustrated as $V_{20}$. When voltage is applied across terminals 16 and 18 with capacitor 12 uncharged, the full voltage appears across resistor 14. Current flows through resistor 14 and capacitor 12, causing capacitor 12 to charge and develop a voltage $V_{13}$, at a rate which is initially large but which decreases with increasing time. The time scale in FIG. 2 depends upon the magnitude of the product of the resistance of resistor 14 and the capacitance of capacitor 12. When both the capacitance and resistance are large, the current in response to any given signal is small, and the voltage $V_{13}$ across the capacitor rises slowly.

The finite input current required by amplifier 22 represents an unknown load across the integrating capacitor by which current flowing through resistor 14 bypasses capacitor 12 and does not contribute to the integrated output. A practical limit on increases in the resistance of resistor 14 is reached when the current flow through resistor 14 is of the same order of magnitude as the input current required by amplifier 22. In order to take normal manufacturing tolerances into account and thereby insure that the signal integrator actually integrates, the current through resistor 14 must always exceed the input current of amplifier 22. Inexpensive IC processes produce amplifiers in which the input current is substantial.

In principle, it is possible to substantially increase the time constant by making resistor 14 and capacitor 12 relatively large-valued. However, in the context of inexpensive integrated circuit processing, resistor 14 can have a maximum resistance of approximately 10 kilohms, and capacitor 12 a capacitance of approximately 10 picofarads. The time constant of such an integrator (the time in which the voltage across the capacitor reaches 63% of the applied voltage) is approximately one-tenth of one microsecond, which is quite short by comparison with the period of the signals normally encountered in television signal processing applications.

As mentioned, it is possible to substantially reduce the charging current produced in response to a signal voltage without the use of large-valued resistors. In FIG. 3, for example, a source 20 produces a signal current through resistor 14 to a conventional cube-root circuit, designated generally as 200, such as described in U.S. Pat. No. 3,868,581 —A. A. Ahmed entitled "CURRENT AMPLIFIER". In response to the signal current through resistor 14, transistor 202 of circuit 200 produces a charging current for capacitor 12 which is proportional to the cube-root of the signal current in resistor 14. When the charging current supplied by transistor 202 is small, however, the input forward bias current of amplifier 22 becomes significant. A resistor indicated in FIG. 3 as a dashed-line symbol 23, coupled across capacitor 12, represents the input impedance of amplifier 22, the leakage of capacitor 12 or both. The presence of resistor 23 causes charging current produced by transistor 202 to be shunted away from capacitor 12, reducing its charge rate by an undetermined amount. Thus, simple reduction of the charging current cannot produce a reliable integrator.

Attempts have also been made to increase the time constant of an integrating circuit by the use of a Miller integrator, as illustrated in FIG. 4. For purposes of comparison with FIG. 1, the Miller integrator of FIG. 4 has its input resistor 14 coupled to B+ as a source of signal voltage. It should be understood that resistor 14 may alternatively be coupled between terminal 13 and a signal source.

In FIG. 4, a Miller amplifier 30 has its non-inverting input terminal coupled to ground. The output of amplifier 30 is coupled to the end of capacitor 12 remote from terminal 13. For purposes of explanation, assume that, at a time $T_0$ of FIG. 5, equal supply voltages B+ and B− are simultaneously applied to the circuit of FIG. 4, with capacitor 12 initially uncharged. At time $T_0$, the output voltage $V_{32}$ of amplifier 30 will be zero. With increasing time, the output voltage of amplifier 30 will ramp negative as illustrated by voltage $V_{32}$ of FIG. 5. At a time $T_1$, the output voltage of amplifier 30 will reach B−, and the amplifier will saturate. After time $T_1$, amplifier 30 can have no further control over the charge rate. Time $T_1$ occurs at a time equal to one time constant of the signal integrator formed by capacitor 12 and resistor 14. Thus, the Miller integrator produces a ramp with the linearity characteristics associated with a large time constant, but with a duration of signal integration which is relatively short. Unless the supply voltages for amplifier 30 are relatively large, the Miller integrator cannot perform signal integration for an interval significantly greater than that of an RC integrator. Furthermore, the Miller integrator draws input current, and is subject to the same objections as the arrangement of FIG. 3.

In the signal integrating circuit 40 of FIG. 6, embodying the invention, a signal source V, at a terminal 41, is coupled to a resistor 42 for producing a signal current $i_0$ therein. Resistor 42 is coupled to a terminal 43, the inverting input terminal of an integrator amplifier 44. The noninverting input terminal of amplifier 44 is coupled illustratively to ground. A signal integrating capacitor 45 is coupled between terminal 43 and an output terminal 46 of amplifier 44. A portion of the signal current $i_0$ flows as a current $i_{45}$ into capacitor 45 to produce an integrated signal output $V_{40}$ at terminal 46.

A differentiating and degenerative or negative feedback circuit 47 is coupled between output terminal 46 and inverting terminal 43 of integrating amplifier 44. Differentiating feedback circuit 47 includes an RC differentiator comprising a capacitor 48 and a resistor 49. Capacitor 48 is coupled between terminal 46 and a terminal 50, the inverting input terminal of a differentiator amplifier 51. Resistor 49 is coupled between terminal 50 and a terminal 52, an output terminal of amplifier 51.

The voltage developed at terminal 52 is a voltage $V_{47}$ which is the differential signal of the integrated output voltage $V_{40}$. The differential voltage $V_{47}$ is inverted by an amplifier 53 and coupled to inverting input terminal 43 of integrator amplifier 44 through a resistor 54 to produce a shunting differentiated and degenerative feedback current $i_{47}$ flowing from input terminal 43 through resistor 54.

Neglecting the relatively small bias current flowing into amplifier 44 from terminal 43, the differentiated feedback current $i_{47}$ bypasses a portion of the signal current $i_0$ away from capacitor 45, resulting in a smaller signal current $i_{45}$ being integrated. The effect of the shunting feedback current $i_{47}$ is to slow the rate of signal integration or increase the signal integration time or increase the effective time-constant associated with integrating capacitor 45, thereby enabling a smaller capacitor to be used for a given signal integration time.

Assume, for example, that signal integrating circuit 40 is required to produce a ramp voltage as the integrated output voltage $V_{40}$. The signal V at terminal 41 is then a constant voltage, equal in this example to the B+ voltage. Without differentiating feedback network 47, the voltage $V_{40}$ would equal the ramp voltage $V_{32}$, illustrated in FIG. 5 for the conventional Miller integrator. The slope of voltage $V_{40}$ equals $1/T_{45}$ volts per second, where $T_{45} = R_{42} \cdot C_{45}$; that is, the slope is proportional to the reciprocal of the RC time constant associated with capacitor 45. With differentiating and shunting feedback network 47 included, however, the integrated ramp output voltage, at terminal 46, as will be further explained, comprises a ramp voltage $V_{40}$, of shallower slope than voltage $V_{32}$. That is to say, the effective time constant $T_{40}$ of integrating capacitor 40 is substantially greater than the previously mentioned time constant $T_{45}$. Thus, for example, for a given ramp voltage output, capacitor 45 may be selected to be of a substantially smaller value, suitable for fabrication on an integrated circuit substrate. Alternatively, to achieve a relatively large signal integration time for a given supply voltage for amplifier 44, signal integrating circuit 40, including the differentiating feedback, provides an increase of signal integrating time from the interval $T_0$–$T_1$ to the larger interval $T_0$–$T_1'$, as illustrated in FIG. 5.

With differentiator amplifier 51 maintaining terminal 50 at a virtual ground, the negative-going ramp voltage at output terminal 46 is differentiated by capacitor 48 and resistor 49 to produce a constant current flowing through resistor 49. The positive constant voltage $V_{47}$ at terminal 52 is inverted by amplifier 53 to produce a negative magnitude constant voltage $-V_{47}'$ at terminal 55.

With integrator amplifier 44 maintaining terminal 43 at a virtual ground, a constant differentiated shunt current $i_{47} = V_{47}/R_{54}$ flows in resistor 54, thereby bypassing a predetermined amount of signal current $i_0$ from capacitor 45. That is to say, the signal current $i_{45}$ that is to be integrated no longer equals $i_0$ but equals a constant current $i_{45} = i_0 = i_{47}$, where $i_0 = V/R_{42}$. With constant signal current $i_{45}$ now of smaller magnitude, the ramp output signal is of shallower slope, as desired if greater signal integration time is desired. Amplifiers 51 and 53 combine to function as a feedback controlled shunting path to shunt a portion of the signal current away from capacitor 45.

The effective time constant increase is a function in part of the time constant associated with differentiating capacitor 48, the gain of amplifier 53 and the ratio of the resistance of resistor 54 to the resistance of resistor 42. For example, if resistor 54 is selected sufficiently small in value when compared to resistor 42 in order to shunt all but 1/1000th of the signal current $i_0$ away from integrating capacitor 45, the slope of the integrated ramp output voltage would be approximately 1/1000th that of a Miller integrator generated ramp voltage, thereby increasing the signal integration time by 1000.

By providing a degenerative feedback circuit 47, improved stability is obtained against the effects of leakage current in capacitor 45 or switch 56 and against the errors introduced at low levels of input current into amplifier 44. The output ramp, differentiated by differentiating circuit 47, provides a replica of the constant input voltage with a magnitude determined by the rate of signal integration which is coupled to shunting amplifier 51. With this arrangement, the differentiator controls the integration rate and therefore the effective time constant associated with capacitor 45.

The precision of the signal integrator with differentiating feedback embodying the invention is improved over prior art integrators in part because the feedback automatically provides whatever input current the sensing amplifier or following load requires. Since the output voltage of an integrator operated as a ramp generator is variable, the load current in principle is likewise widely variable. The feedback therefore compensates for this variation. In the case of a ramp generator, the differentiating feedback path produces a substantially constant voltage, and the input current requirements of any amplifier in the feedback path will therefore in principle be a constant, which may be compensated.

To produce repetitive output ramp voltages, integrating capacitor 45 is periodically discharged by a controllable switch 56. The on-off state of switch 56 is controlled by switching signals 57 coupled to a control terminal 58 of switch 56.

Figure 7:
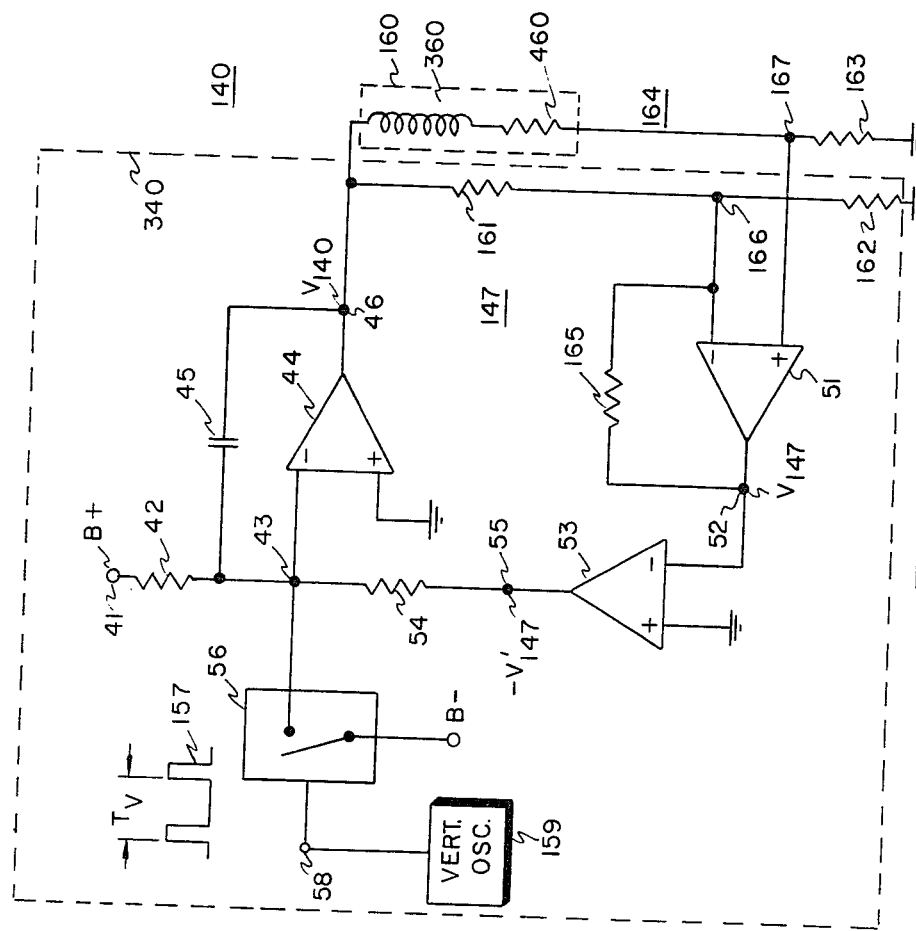
FIG. 7 illustrates another signal integration and vertical deflection circuit embodying the invention.

FIG. 7 illustrates a signal integrating circuit with differentiated feedback, embodying the invention, arranged as a vertical deflection circuit 140. Elements of the circuits of FIGS. 6 and 7 performing similar functions are identically labelled. A conventional vertical oscillator 159 provides a vertical deflection rate, 1/T_V, switch signal 157 to controlled switch 56. During the interval when switching signal 157 is in its lower voltage level, for example, a negative-going ramp voltage $V_{140}$ is developed at terminal 46 to produce a ramp vertical deflection current in a vertical deflection winding 160. The inductance associated with vertical deflection winding 160 is illustrated as an inductor 360 and the resistance of vertical deflection winding 160 is illustrated as a resistor 460.

A differentiating feedback network 147 is coupled between the output terminal 46 of integrator amplifier 44 and the amplifier inverting input terminal 43. To increase the effective time constant associated with integrating capacitor 45, thereby enabling the use of a reduced-value capacitor to generate a relatively long duration ramp or vertical deflection current producing voltage $V_{140}$, differentiating feedback network 147 provides a constant magnitude positive voltage $V_{147}$ at output terminal 52 of differentiator and shunting amplifier 51.

To provide differentiation of the integrated output voltage, the inductance 360 of vertical deflection winding 160 is used to form an RL differentiator. The ramp deflection current flowing through winding 160 is differentiated to produce a constant voltage across the inductance portion 360, which is a negative value at terminal 46 with respect to the inductance terminal remote from terminal 46. This inductively derived constant voltage is coupled across the input terminals of shunting amplifier 51 by means of resistance 460 and a resistor 161, thereby producing the required constant voltage $V_{147}$ at terminal 52. A feedback resistor 165 is coupled between terminal 52 and the inverting input terminal of amplifier 51 for stabilizing and controlling the gain of shunting amplifier 51.

The ramp current flowing through deflection winding 160 will produce a ramp voltage across the resistance portion 460. To prevent this resistively derived ramp voltage from being developed across the input terminals of amplifier 51, resistance 460, together with resistors 161–163, form a resistive bridge circuit 164 with a bridge output terminal 166 coupled to the inverting input terminal of amplifier 51 and with a bridge output terminal 167 coupled to the noninverting input terminal. By proper adjustment of bridge resistances, the bridge will be balanced with respect to the resistively derived ramp voltage coupled to the bridge, thereby preventing an undesired ramp voltage from being developed at terminal 52.

Using the differentiating feedback network 147, capacitor 45 may be of sufficiently small value to enable the vertical deflection circuit portion 340, including capacitor 45, to be fabricated entirely on an integrated circuit substrate.

Figure 8:
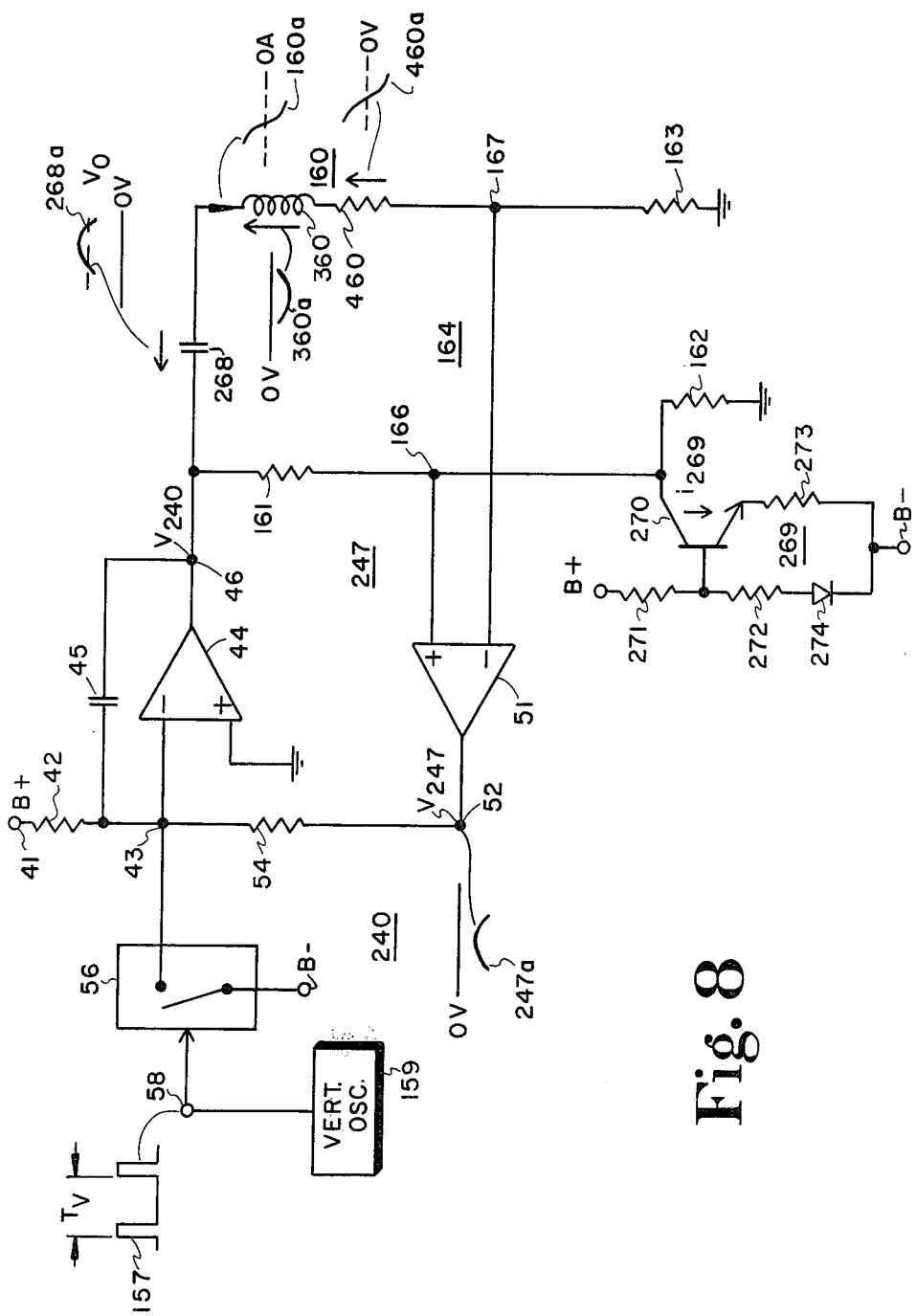
FIG. 8 illustrates still another signal integration and vertical deflection circuit embodying the invention.

FIG. 8 illustrates a vertical deflection circuit 240, embodying the invention, and including circuitry which provides for S-shaping or S-correcting of the sawtooth vertical deflection current flowing in vertical deflection winding 160. Elements of the circuits of FIG. 6–8 performing similar functions are identically labelled. In FIG. 8, bridge output terminal 166 is coupled to the noninverting input terminal of differentiator amplifier 51 rather than the inverting input terminal of the corresponding amplifier in FIG. 7. Thus, inverting amplifier 53 of FIG. 7 is omitted from the circuit of FIG. 8.

To provide S-shaping of the sawtooth vertical deflection current, vertical deflection winding 160 is AC coupled through an "S" shaping capacitor 268 to output terminal 46 of integrator amplifier 44. The S-shaped sawtooth vertical trace current 160a, illustrated in FIG. 8, comprises a distorted ramp waveform which is of relatively shallow shape at the beginning and end of vertical trace and of relatively steep slope in the center of trace. To produce such a distorted waveform, the differentiated feedback voltage $V_{147}$ during trace is also distorted from a constant negative voltage waveform to an approximately parabolic waveform 247a, more negative at the beginning and end of vertical trace than at the center. Such a parabolic waveform shunts more input signal current away from integrating capacitor 45 during the beginning and end of vertical trace than during the center of trace, as is required to produce an S-shaped sawtooth vertical trace current 160a.

To produce parabola 247a, a parabolic voltage is coupled to noninverting input terminal 166 of amplifier 51. This voltage is developed across capacitor 268 because the capacitor integrates the sawtooth vertical trace current into an approximate parabolic voltage 268a. The undesirable effect of the antiphase parabolic voltage 360a developed across inductor 360 by the "S" shaping component of the deflection current is relatively insignificant because of its relatively low amplitude compared to parabolic voltage 268a. The resistively derived sawtooth voltage 460a developed across resistance 460 does not appear at terminal 52 due to the balancing action provided by bridge circuit 164.

A constant current source 269, comprising a transistor 270, resistors 271–273 and a diode 274 is coupled to terminal 166 and produces a compensating current $i_{269}$ that flows in resistor 161. The magnitude of current $i_{269}$ is selected such that the voltage drop across resistor 161 that is produced by current $i_{269}$ equals the DC voltage $V_0$ developed across capacitor 268. Thus, the DC voltage $V_0$ produces no undesirable feedback voltage at terminal 52.

Figure 9:
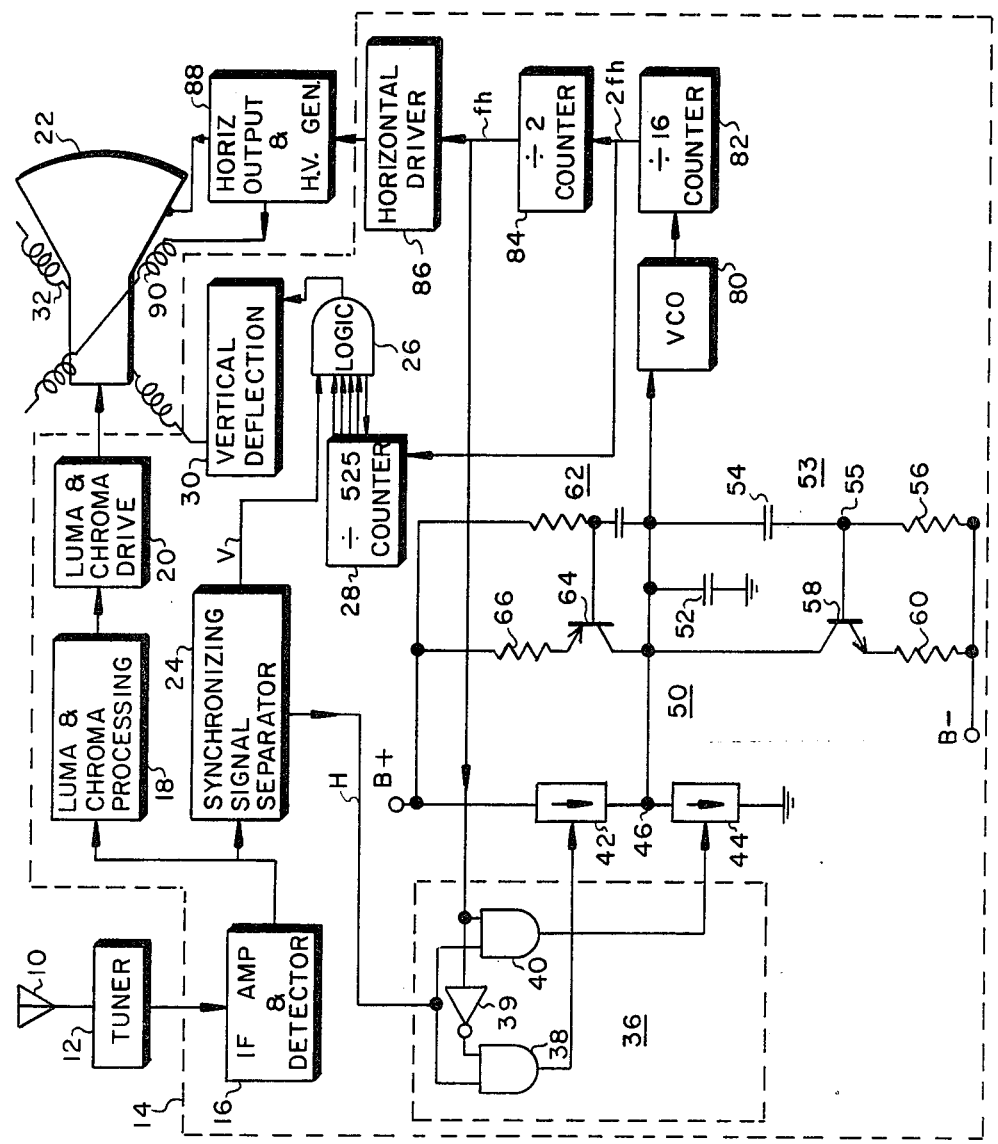
FIG. 9 illustrates television receiver circuitry including a signal integration and automatic frequency and phase control circuit embodying the invention.

FIG. 9 illustrates a televison receiver circuit in which the invention is embodied as a filter for an automatic frequency and phase control (AFPC) loop. In FIG. 9, an antenna 10 receives broadcast television signals, one of which is selected by a tuner 12 and downconverted to an IF frequency. The IF frequency signal is coupled to the signal processing portions of the television receiver, which in principle may be formed on an integrated-circuit (IC) chip designated generally as 14. The IF signals are applied to an IF amplifier and detector illustrated together as a block 16, which produces composite video signals for application to a luminance and chrominance drive circuit illustrated as a block 20, by way of processing circuits illustrated as a block 18. Luminance and chrominance drive circuit 20 is coupled to the elements (not shown) of a kinescope 22.

Composite video is also applied to a synchronizing signal separator 24, which separates the vertical and horizontal signals from each other and from the composite video. The vertical synchronizing signals are applied over a conductor V to a conventional vertical count-down circuit including a logic control circuit 26 and a divide-by-525 counter 28. Counter 28 is clocked by a signal at twice the horizontal frequency (2 fH). The vertical count-down circuit compensates for excessive sensitivity of the synchronizing signal separator to noise by rejecting all synchronizing signals except those identified as sync; and, in the absence of such identification, produces counter-generated synchronizing signals which are applied to a vertical deflection circuit illustrated as a block 30, which produces vertical deflection current through vertical deflection windings 32 associated with a cathode ray tube 22.

Horizontal synchronizing signals are applied from separator 24 to a phase detector designated generally as 36. Phase detector 36 includes first and second AND gates 38 and 40, each having an input coupled to receive separated horizontal sync. The output of gate 38 is coupled to a control input terminal of a conventional gated or switched current source 42, and the output terminal of AND gate 40 is coupled to a control input terminal of a conventional gated or switched current source 44. The main current conducting paths of gated current sources 42 and 44 are serially coupled between B+ and ground, and have an output junction 46 therebetween.

Output junction 46 of phase detector 36 is coupled by way of a phase-lock loop (PLL) filter designated generally as 50 to a voltage-controlled oscillator (VCO) 80. Filter 50 includes a capacitor 52 coupled to output junction 46. VCO 80 operates at a high frequency such as 503 KHz. The VCO output signal is applied to a divide-by-16 counter 82 to generate a 2 fH signal for clocking counter 28. The 2 fH output of counter 82 is also applied to a divide-by-2 counter 84 which produces horizontal frequency (fH) signals which are applied to a horizontal driver stage 86. Driver stage 86 amplifies the horizontal drive signals and applies them to a horizontal output and high voltage generating stage 88, which produces ultor voltage for cathode ray tube 22 and horizontal deflection current through horizontal deflection windings 90 associated with kinescope 22.

The phase-lock loop is closed by coupling the fH output of counter 84 to a second input of AND gate 40 and, by way of an inverter 39, to a second input of AND gate 38.

In operation, the PLL maintains a transition of the fH signal from counter 84 centered on the horizontal synchronizing pulse produced by separator 24. The horizontal synchronizing pulse enables phase detector 36 by enabling AND gates 38 and 40. When the fH signal is low, gate 38 responds and gate 40 does not respond. Gate 38 then enables current source 42, allowing a predetermined current to flow from B+ to charge capacitor 52. When the fH signal makes a transition to a high logic 1 level, source 42 is turned off and AND gate 40 turns on current source 44, thereby producing a predetermined discharge current of the same magnitude as the charging current produced by source 42. At the end of the synchronizing signal interval, gates 38 and 40 and sources 42 and 44 are de-energized. If the transition of the fH signal is centered on the sync signal, the current charging capacitor 52 from the signal integrating switched current source 42 equals the discharging current produced by signal integrating switched current source 44. Capacitor 52 has the same charge after the phase detecting interval as before, whereby the voltage applied to the rate control input of VCO 80 remains unchanged and the VCO does not slew. Errors in phase modulate the control pulses coupled to current sources 42 and 44, thereby producing a net imbalance in the charge and discharge currents in capacitor 52, and cause VCO 80 to slew to correct the error.

A differentiator designated generally as 53 includes the serial connection of a differentiating capacitor 54 and a resistor 56 connected between junction 46 and a source B− of operating potential. An NPN transistor 58 has its base connected to the output of differentiator 53, and its emitter connected to B− by a resistor 60. The collector of transistor 58 is coupled to junction 46. Transistor 58 can sink or shunt currents produced by source 42. When source 42 is conducting, the voltages at junctions 46 and 55 tend to increase, thereby turning on transistor 58 to sink a portion of the current as determined by the magnitude of resistor 60.

While differentiator 53 and transistor 58 will increase the effective time constant of the combination of capacitor 52 and the high impedance of source 42, transistor 58 as poled cannot sink currents produced by source 44. In order to provide bidirectional control of the time constant, a second differentiator designated generally as 62 is coupled between junction 46 and B+. The output of differentiator 62 is applied to the base of a PNP transistor 64, the emitter of which is coupled to B+ by a resistor 66. Differentiator 62 enables transistor 64 and provides a sink for the current produced by source 44.

The differentiated feedback provided by differentiators 53 and 62 increases the effective time constant associated with capacitor 52 during the charging and discharging intervals of capacitor 52. During those intervals between horizontal synchronizing pulses in which sources 42 and 44 are not conducting, no change in voltage is expected across capacitor 42, and differentiators 53 and 62 produce no output voltage for application to the bases of transistors 58 and 64, respectively. If capacitor 52 is leaky or if the rate control input terminal of VCO 80 requires current, the voltage across capacitor 52 can change even during the period in which sources 42 and 44 are disabled. If the voltage across capacitor 52 changes, the appropriate one of differentiators 53 and 62 will produce an output voltage for enabling a transistor 58 or 64 to reduce the error. This mode of operation of the phase detector is equivalent to that of a sample and hold circuit.

In the discussion of loop filter 50, no mention was made of the base-emitter offset voltages of transistors 58 and 64 which might affect the sensitivity of the feedback. However, it will be obvious to those skilled in the art that differential or operational amplifiers may be used in place of transistors 58 and 64 for improved sensitivity.

What is claimed is:

1. A signal integrating circuit, comprising:
   a source of signal current;
   a signal integrating capacitance;
   integrating means coupled to said source and to said signal integrating capacitance for generating at an output terminal a voltage which consists essentially of a voltage representative of the time-integration of said signal current;
   shunting means coupled to said signal integrating capacitance for bypassing a portion of said signal current from said signal integrating capacitance;
   differentiating means coupled to said output terminal for developing a differentiated output signal; and
   feedback means coupled to said differentiating means and to said shunting means for applying said differentiated output signal to said shunting means in a degenerative manner for increasing the effective time constant associated with said signal integrating capacitance relative to the time constant associated therewith in the absence of said feedback means.

2. A circuit according to claim 1 wherein said differentiating means comprises a resistor and a capacitor.

3. A circuit according to claim 1 wherein said differentiating means comprises a resistor and an inductor.

4. A circuit according to claim 1 wherein said integrating means includes a first amplifier with a terminal in common with said output terminal, said signal integrating capacitance being coupled between an input terminal of said first amplifier and said output terminal.

5. A circuit according to claims 1 or 4 wherein said shunting means comprises a second amplifier with an output terminal of said second amplifier being coupled to said signal integrating capacitance and with said differentiated output signal being applied to an input terminal of said second amplifier.

6. A circuit according to claim 3 wherein said inductor comprises a vertical deflection winding, said voltage representative of the time integration of said signal current developing a vertical deflection current in said vertical deflection winding.

7. A circuit according to claim 6 wherein said shunting means comprises a shunting amplifier coupled to said signal integrating capacitance, said vertical deflection winding coupled to one of an inverting and a noninverting terminal of said shunting amplifier.

8. A circuit according to claim 7 including a bridge circuit coupled to said vertical deflection winding and to one of said inverting and noninverting terminals for preventing the resistive component of said vertical deflection winding from developing a voltage at the output of said shunting amplifier.

9. A circuit according to claims 7 or 8 including an "S" shaping capacitor coupled to said vertical deflection winding, the parabolic voltage developed across said "S" shaping capacitor being coupled to an input terminal of said shunting amplifier.

10. A circuit according to claim 9 including a current source coupled to an input terminal of said shunting amplifier for preventing the DC voltage developed across said "S" shaping capacitor from producing a voltage at the output of said shunting amplifier.

11. A synchronized controlled oscillator including a signal integrating circuit for an automatic frequency and phase control circuit, comprising:
a source of synchronizing input signals;
a controlled oscillator for providing repetitive output signals;
an automatic frequency and phase controlled circuit responsive to said input signals and said repetitive output signals for developing modulated control pulses representative of the phase difference between said input signals and said repetitive output signals;
a signal integrating capacitance;
integrating means having an output terminal coupled to said controlled oscillator, the voltage thereat controlling the frequency and phase of said repetitive output signals, said integrating means including a switched current source coupled to said signal integrating capacitance and responsive to said modulated control pulses for providing a modulated signal current to said signal integrating capacitance;
means coupled to said output terminal for developing a differentiated voltage from the voltage developed at said output terminal;
shunting means coupled to said signal integrating capacitance for bypassing a portion of said modulated signal current from said signal integrating capacitance; and
means for applying said differentiated voltage to said shunting means to establish a degenerative feedback path which substantially increases the effective time constant associated with said signal integrating capacitance to provide at said output terminal an integrated output voltage of said modulated signal current that is representative of said phase difference, thereby synchronizing the repetitive output signals of said controlled oscillator with said input signals.

12. A signal integrating circuit fabricated entirely on an integrated circuit substrate, comprising:
a source of signal current;
signal integrating means coupled to said source for providing an integrated output signal of said signal current at an output terminal of said signal integrating means, said signal integrating means including a signal integrating capacitance entirely fabricated on said integrated circuit substrate for receiving said signal current;
differentiating means coupled to said output terminal for differentiating said integrated output signal; and
amplifier means coupled to said differentiating means and to said signal integrating capacitance for applying an amplified differentiated signal of said integrated output signal
to said signal integrating capacitance to shunt a portion of said signal current from said signal integrating capacitance.

* * * * *